United States Patent [19]

Ulmer et al.

[11] 4,375,595

[45] Mar. 1, 1983

[54] SWITCHED CAPACITOR TEMPERATURE INDEPENDENT BANDGAP REFERENCE

[75] Inventors: Richard W. Ulmer; Roger A. Whatley, both of Austin, Tex.

[73] Assignee: Motorola, Inc., Schaumburg, Ill.

[21] Appl. No.: 231,073

[22] Filed: Feb. 3, 1981

[51] Int. Cl.[3] .......................... H03K 3/01; H03K 3/26

[52] U.S. Cl. ............................... 307/297; 307/299 A; 307/310; 307/490; 323/314

[58] Field of Search ............... 307/355, 310, 297, 490, 307/491; 323/313-318; 330/9; 328/127

[56] References Cited

U.S. PATENT DOCUMENTS

| | | | |
|---|---|---|---|
| 4,071,813 | 1/1978 | Dobkin | 323/313 |
| 4,210,872 | 7/1980 | Gegorian | 330/9 |
| 4,249,122 | 2/1981 | Widlar | 323/313 |
| 4,263,519 | 4/1981 | Schade, Jr. | 307/310 |
| 4,287,439 | 9/1981 | Leaschmer | 307/297 |
| 4,295,089 | 10/1981 | Cooperman | 323/313 |
| 4,317,054 | 2/1982 | Caruso et al. | 307/297 |
| 4,325,018 | 4/1982 | Schade, Jr. | 307/310 |

OTHER PUBLICATIONS

IEEE Journal of Solid State Circuits, "A Simple Three-Terminal IC Bandgap Reference", by A. P. Brokaw, vol. scq, No. 6, 12/74, pp. 388-393.

IEEE Journal of Solid State Circuits, "MOS Sampled Data Recursive Filters Using Switched Capacitor Integrators", by B. J. Hosticka et al., vol., SC12, No. 6, 12/77, pp. 600-604.

"Potential of MOS Technologies for Analog Integrated Circuits", Reprint IEEE Solid State Circuits, vol. SC13, pp. 285-295, 6/78 by Hodges.

*Primary Examiner*—Stanley D. Miller
*Assistant Examiner*—B. P. Davis
*Attorney, Agent, or Firm*—Anthony J. Sarli, Jr.; Jeffrey Van Myers; Robert Lee King

[57] ABSTRACT

A temperature stable bandgap voltage reference source utilizing two substrate bipolar transistors biased at different emitter current densities is provided. Switched capacitors are used to input the $V_{be}$ and the $\Delta V_{be}$ of the transistors (NTC and PTC voltages, respectively) into an amplifier to provide a reference voltage proportional to the weighted sum of the PTC and NTC voltages. Proper selection of the ratio of the switched capacitors renders the reference voltage substantially independent of temperature. In a modified form of the reference, the reference amplifier is implemented by an auto-zeroed operational amplifier which uses switched capacitor techniques and an integrated capacitor to achieve the auto-zeroing function.

7 Claims, 4 Drawing Figures

SWITCHED CAPACITOR TEMPERATURE INDEPENDENT BANDGAP REFERENCE

CROSS REFERENCE TO RELATED APPLICATIONS

Related subject matter can be found in the following copending application, which is assigned to the assignee, hereof: U.S. Pat. No. 4,355,288, entitled "AUTO-ZEROING OPERATIONAL AMPLIFIER CIRCUIT" filed simultaneously herewith by Stephen H. Kelley, Richard W. Ulmer and Roger A. Whatley.

BACKGROUND OF THE INVENTION

1. Field of the Invention

This invention relates generally to bandgap reference circuits and more particularly to CMOS bandgap reference circuits.

2. Description of the Prior Art

Typically, the best reference for a good reproducible, stable voltage below three volts has been the bandgap reference circuit. As discussed in *Analysis and Design of Analog Integrated Circuits* by Paul R. Gray and Robert G. Meyer (John Wiley and Sons, 1977, pages 239–261), the base to emitter voltage $V_{be}$, of a bipolar transistor exhibits a negative temperature coefficient with respect to temperature. On the other hand, R. J. Widlar has shown that the difference of base to emitter voltages $\Delta V_{be}$ of two bipolar transistors exhibits a positive temperature coefficient with respect to temperature. Thus, the sum of the base to emitter voltage, $V_{be}$, of a bipolar transistor and a differential voltage $\Delta V_{be}$ will be relatively independent of temperature when the sum voltage equals the energy gap of silicon. Such temperature stable references have been created by generating a $V_{be}$ and summing a $\Delta V_{be}$ of such value that the sum substantially equals the bandgap voltage of 1.205 volts.

A standard CMOS process can be used to fabricate open emitter NPN bipolar transistors for use in a bandgap reference circuit such as that taught in U.S. Pat. No. 4,287,439. To create a stable temperature independent CMOS bandgap voltage with amplifying means, such as an operational amplifier, two transistors of varying current density were used as emitter followers having resistors in their emitter circuits from which a differential voltage was obtained. An output voltage having a positive, negative or zero coefficient was thereby produced.

Several factors in the CMOS circuit, however, affected the initial tolerance variation and temperature variation of the bandgap voltage. The dominant initial tolerance error was caused by the offset voltage associated with the operational amplifier being multiplied by the ratio of two resistors in the emitter circuit of the transistor with lowest current density. Further disadvantages of the prior art are problems with P-resistor matching and a 2:1 variation in the P-resistivity over temperature. Previous CMOS bandgap circuits also required a startup circuit.

SUMMARY OF THE INVENTION

It is an object of the present invention to provide a bandgap reference utilizing substrate bipolar transistors and MOS transistors to provide a reference voltage which is substantially temperature stable and substantially independent of process variations.

It is a further object of the invention to provide a bandgap reference fabricated using a standard CMOS process and switched capacitor techniques, which sums the $V_{be}$ and $\Delta V_{be}$ of substrate bipolar transistors to derive a near zero temperature coefficient reference voltage.

According to an aspect of the invention, there are provided a first and a second substrate bipolar transistor wherein the emitter area of the first transistor is much larger than the emitter area of the second transistor. Since the second transistor is operated at a higher current density than the first transistor, the $V_{be}$ of the second transistor is greater than the $V_{be}$ of the first transistor. Using switched capacitors coupled to the emitters of the transistors, the base to emitter voltages of the devices are sampled. When the difference between the two sampled voltages are added in the correct proportion, the result is a voltage with a substantially zero temperature coefficient. The above and other objects, features and advantages of the present invention will be more clearly understood from the following detailed description taken in conjunction with the accompanying drawings.

DESCRIPTION OF THE PREFERRED EMBODIMENT

Figure 1:
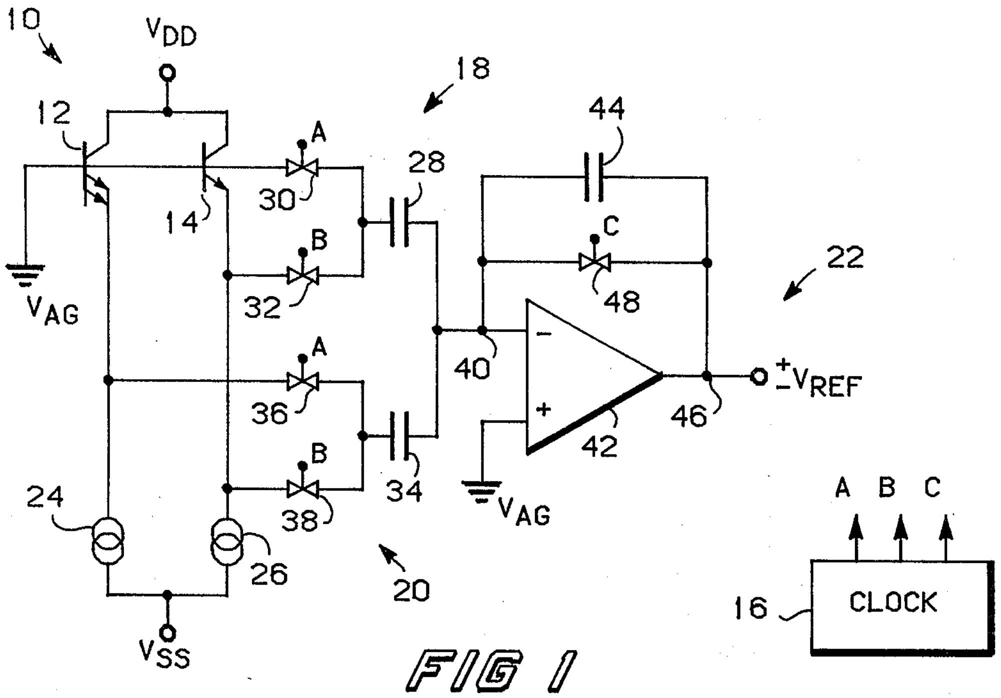
FIG. 1 is a schematic diagram illustrating one preferred embodiment of the invention.

Shown in FIG. 1, is a switched capacitor bandgap reference circuit 10 constructed in accordance with the preferred embodiment of this invention. The bandgap reference circuit 10 is comprised generally of first and second bipolar transistors 12 and 14, respectively, a clock circuit 16, a first switched capacitance circuit 18, a second switched capacitance circuit 20, and an amplifier circuit 22.

Each of the first and second bipolar transistors 12 and 14 has the collector thereof connected to a positive supply $V_{DD}$, the base thereof connected to a common reference voltage, say analog ground $V_{AG}$, and the emitter thereof connected to a negative supply $V_{ss}$ via respective current sources 24 and 26. In the preferred form, the current sources 24 and 26 are constructed to sink a predetermined ratio of currents, and transistor 12 is fabricated with a larger emitter area than the transistor 14. Since the transistors 12 and 14 are biased at different current densities they will thus develop different base-to-emitter voltages, $V_{be}$. Because the transistors 12 and 14 are connected as emitter followers, the preferred embodiment may be fabricated using the substrate NPN in a standard CMOS process.

In the first switched capacitance circuit 18, a capacitor 28 has an input connected via switches 30 and 32 to the common reference voltage $V_{AG}$ and the emitter of transistor 14, respectively. In the second switched capacitance circuit 20, a capacitor 34 has an input connected via switches 36 and 38 to the emitter of transistors 12 and 14, respectively. Capacitors 28 and 34 have the outputs thereof connected to a node 40. In the preferred embodiment, switches 30, 32, 36, and 38 are CMOS transmission gates which are clocked in a conventional manner by the clock circuit 16. Switches 30 and 36 are constructed to be conductive when a clock signal A applied to the control inputs thereof is at a high state, and non-conductive when the clock signal A is at a low state. In contrast, switches 32 and 38 are preferably constructed to be conductive when a clock signal B applied to the control inputs thereof is at a high state and non-conductive when the clock signal B is at a low state.

In this configuration, switches 30 and 32 will cooperate to charge capacitor 28 alternately to the base voltage of transistor 14 and the emitter voltage of transistor 14, thus providing a charge related to $V_{be}$ of transistor 14. Simultaneously, switches 36 and 38 cooperate to charge capacitor 34 alternately to the emitter voltage of transistor 12 and the emitter voltage of transistor 14, thus providing a charge related to the difference between the base to emitter voltages, i.e., the $\Delta V_{be}$, of the transistors 12 and 14. As will be clear to those skilled in the art, the voltage, $V_{be}$, will exhibit a negative temperature coefficient (NTC). On the other hand, it is well known that the voltage $\Delta V_{be}$ exhibits a positive temperature coefficient (PTC). Thus, it will be clear that the weighted sum of these voltages, $V_{be}+K\Delta V_{be}$, where $K=C_{34}/C_{28}$ may be made substantially temperature independent by appropriate selection of the ratio of capacitors 28 and 34.

In the amplifier circuit 22, an operational amplifier 42 has its negative input coupled to node 40 and its positive input coupled to the reference voltage $V_{AG}$. A feedback capacitor 44 is coupled between the output of operational amplifier 42 at node 46 and the negative input of the operational amplifier 42 at node 40. In the preferred form, a switch 48 is coupled across feedback capacitor 44 with the control input thereof coupled to clock signal C provided by clock circuit 16. By periodically closing switch 48, the operational amplifier 42 is placed in unity gain, and any charge on capacitor 44 is removed.

Figure 2:
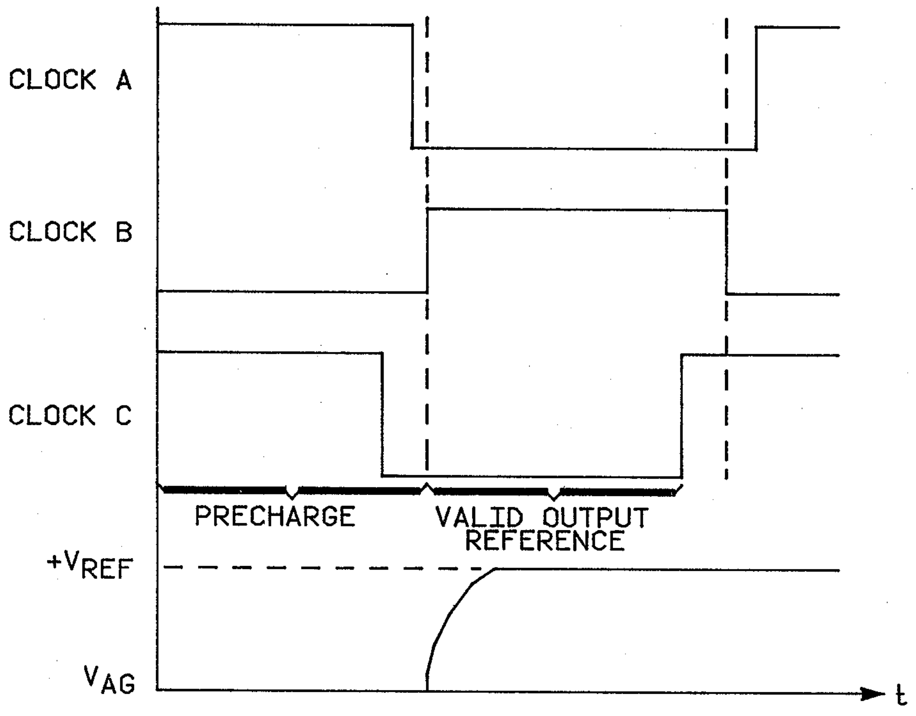
FIG. 2 is a graphic timing diagram for the schematic embodiment shown in FIG. 1.

As shown in FIG. 2, the clock circuit 16 initially provides the clock signal A in a high state to close switches 30 and 36, and clock signal B in a low state to open switches 32 and 38. Simultaneously, the clock circuit 16 provides the clock signal C in a high state to close the switch 48. During this precharge period, feedback capacitor 44 is discharged, and, ignoring any amplifier offset, capacitors 28 and 34 are charged to the reference voltage, $V_{ag}$, and the $V_{be}$ of the transistor 12, respectively. A short time before the end of the precharge period, the clock circuit 16 opens switch 48 by providing the clock signal C in a low state. Shortly thereafter, but still before the end of the precharge period, the clock 16 opens switches 30 and 36 by providing the clock signal A in the low state. At the end of the precharge period and the start of a valid output reference period, the clock circuit 16 closes switches 32 and 38 by providing the clock signal B in the high state. At this time, the voltage on the terminals of capacitor 28 changes by $-V_{be}$ of transistor 14 and the voltage on the terminals of capacitor 34 changes by the difference between the base to emitter voltages of the transistors 12 and 14, $(V_{be12}-V_{ebe14})$. This switching event causes an amount of charge $Q=-V_{be14}C_{28}+(V_{be12}-V_{be14})C_{34}$ to be transferred to capacitor 44 resulting in an output voltage of $V_{ref}=-1/C_{44}[-V_{be14}C_{28}+(-V_{be12}-V_{be14})C_{34}]$ on node 46. In the preferred form, this positive bandgap reference voltage, $+V_{ref}$, is made substantially temperature independent by making the ratio of capacitors 28 and 34 equal to the ratio of the temperature coefficients of $\Delta V_{be}$ and $V_{be}$. If desired, a negative bandgap reference voltage, $-V_{ref}$, may be obtained by inverting clock signal C so that the precharge and valid output reference periods are reversed.

Figure 3:
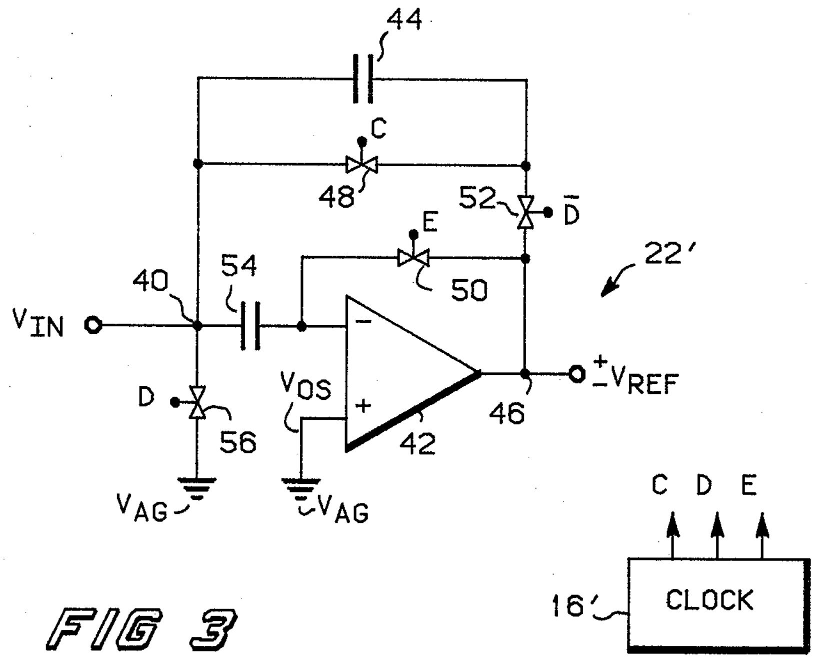
FIG. 3 is a schematic diagram illustrating another embodiment of the amplifier used in the present invention.
Figure 4:
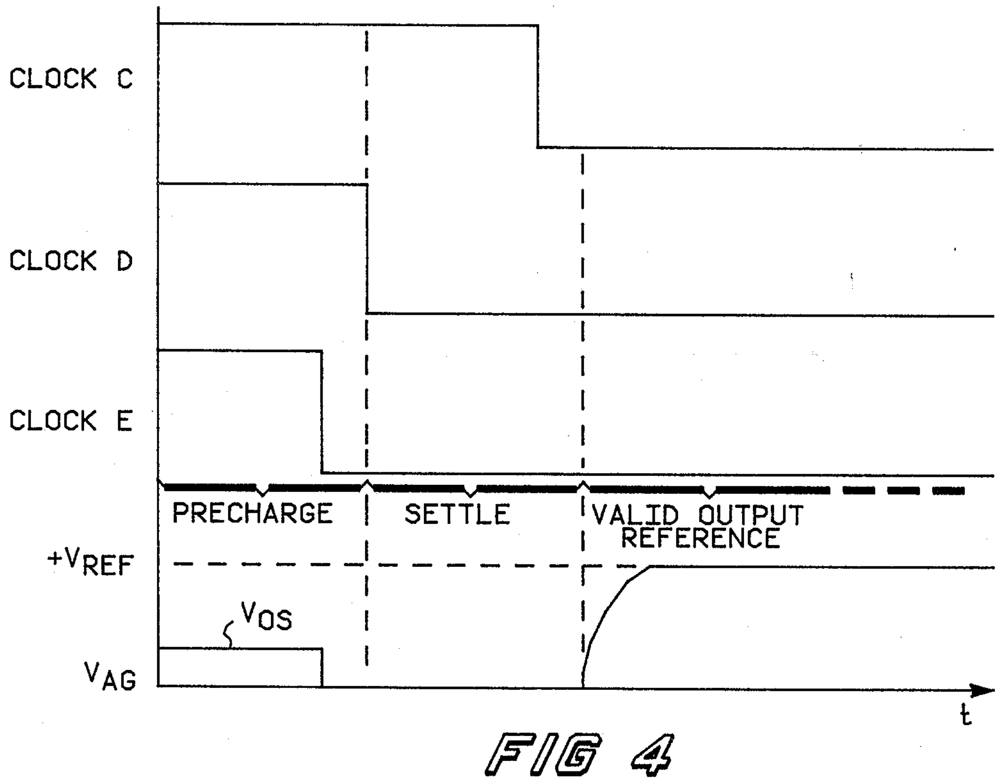
FIG. 4 is a graphic timing diagram for the schematic embodiment shown in FIG. 3.

In general, the accuracy of the bandgap circuit 10 will be adversely affected by the offset voltage of the operational amplifier 42. FIG. 3 illustrates in schematic form, a modified form of amplifier circuit 22' which can be substituted for the amplifier circuit 22 of FIG. 1 to substantially eliminate the offset voltage error. Amplifier circuit 22' is comprised of the operational amplifier 42 which has its positive input coupled to the reference voltage $V_{AG}$. A switch 50 couples the negative input of the operational amplifier 42 to the output terminal at node 46. Switch 48 is coupled in parallel to feedback capacitor 44 and periodically discharges the feedback capacitor. However, one terminal of the feedback capacitor 44 is now connected via a switch 52 to the output of the operational amplifier 42 at node 46. Capacitor 44 is also coupled to an input signal, $V_{IN}$, at node 40. In addition, an offset storage capacitor 54 is coupled between node 40 and the negative input terminal of operational amplifier 42, and a switch 56 is connected between node 40 and the reference voltage $V_{AG}$. In this embodiment, the clock circuit 16' generates the additional clock signals D and E, as shown in FIG. 4 for controlling the switches 56 and 50, respectively, with the inverse of clock signal D controlling switch 52. In this configuration, the bandgap reference circuit 10 has three distinct periods of operation. During the precharge period, the clock circuit 16' provides clock signals C, D, and E in the high state to close switches 48, 56 and 50 and open switch 52. During this period, capacitor 44 is discharged by switch 48. The operational amplifier 42 is placed in unity gain by switch 50, and the offset storage capacitor 54 is charged to the offset voltage, $V_{os}$, of the operational amplifier 42. Near the end of the precharge period, the clock circuit 16' provides clock signal E in the low state to open switch 50, leaving capacitor 54 charged to the offset voltage of the operational amplifier 42. A short time thereafter, the clock circuit 16' provides clock signal D in the low state to open switch 56 and close switch 52. Since this switching event tends to disturb the input node 40, a short settling time is preferably provided before clock circuit 16' provides clock signal C in the low state to open switch 48. Thereafter, the charge stored on feedback capacitor 44 will be changed only by a quantity of charge coupled from the switched capacitor sections 18 and 20. During this third period of circuit operation, labeled the valid output reference period, the reference voltage developed on the node 46 will be substantially free of any offset voltage error. If the offset capacitor 54 is periodically charged to the offset voltage, $V_{os}$, the operational amplifier 42 is effectively autozeroed, with node 40 being the zero-off-set input node.

While the invention has been described in the context of a preferred embodiment, it will be apparent to those skilled in the art that the present invention may be modified in numerous ways and may assume many embodiments other than that specifically set out and described above. Accordingly, it is intended by the appended claims to cover all modifications of the invention which fall within the true spirit and scope of the invention.

It is claimed:

1. A circuit for producing a substantially temperature independent reference voltage, the circuit comprising:

first and second bipolar transistor means having a predetermined base voltage and biased at different current densities to develop first and second emitter voltages, respectively, on the emitters thereof;

clock means for alternately providing first and second non-overlapping clock signals;

first switched capacitance means coupled to said base voltage in response to the first clock signal and to said first emitter voltage in response to the second clock signal, for providing a first charge related to the $V_{be}$ of the first transistor means;

second switched capacitance means coupled to said second emitter voltage in response to the first clock signal and to said first emitter voltage in response to the second clock signal, for providing a second charge related to the difference in the $V_{be}$ of the first and second bipolar transistor means; and amplifier means coupled to the first and second switched capacitance means for providing a reference voltage proportional to the sum of the first and second charges.

2. The circuit of claim 1 wherein each of said switched capacitance means comprises a capacitor and switching means responsive to said clock signals.

3. A circuit for producing a substantially temperature independent reference voltage, the circuit comprising:

first and second bipolar transistor means having a predetermined base voltage and biased at different current densities to develop first and second emitter voltages, respectively, on the emitters thereof;

clock means for alternately providing first and second non-overlapping clock signals;

first switched capacitance means comprising a first capacitor and first switching means responsive to said clock signals, said first switched capacitance means being coupled to said base voltage in response to the first clock signal and coupled to said first emitter voltage in response to the second clock signal, for providing a first charge related to the $V_{be}$ of the first transistor means;

second switched capacitance means comprising a second capacitor and second switching means responsive to said clock signals, said second switched capacitance means being coupled to said second emitter voltage in response to the first clock signal and coupled to said first emitter voltage in response to the second clock signal, for providing a second charge related to the difference in the $V_{be}$ of the first and second bipolar transistor means; and amplifier means coupled to the first and second switched capacitance means comprising an operational amplifier, a feedback capacitor, and switching means for periodically coupling the input and output portions of the feedback capacitor, to provide a reference voltage proportional to the sum of the first and second charges.

4. A method of producing a substantially temperature independent reference voltage comprising the steps of:

biasing first and second bipolar transistor means, having the same predetermined base voltage, at different current densities to develop first and second emitter voltages;

providing first and second non-overlapping clock signals;

coupling an input portion of first capacitance means to said base voltage in response to the first clock signal and to the first emitter voltage in response to the second clock signal, whereby an output portion of said first capacitance means couples a first charge related to the $V_{be}$ of the first transistor means;

coupling an input portion of second capacitance means to said second emitter voltage in response to the first clock signal and to said first emitter voltage in response to the second clock signal, whereby an output portion of said second capacitance means couples a second charge related to the difference in the $V_{be}$ of the first and second transistor means; and amplifying the sum of the charges coupled from the output portions of the first and second capacitance means to provide a reference voltage proportional to the sum of the first and second charges.

5. A circuit for producing a substantially temperature independent reference voltage, the circuit comprising:

first and second transistors having the bases thereof coupled to a predetermined bias voltage, the collectors coupled to a positive supply and the emitters thereof open;

biasing means coupled between the emitters of the first and second transistors and a negative supply biasing said first and second transistors at different current densities;

a first capacitor having a first portion coupled alternately to the predetermined bias voltage and emitter of the first transistor, for providing a first charge related to the $V_{be}$ of the first transistor;

a second capacitor having a first portion coupled alternately to the emitter of the first transistor and the emitter of the second transistor, for providing a second charge related to the difference in the $V_{be}$ of the first and second transistors; and an amplifier coupled to the first and second capacitors, for providing a reference voltage proportional to the sum of the first and second charges.

6. A circuit for producing a substantially temperature independent reference voltage, the circuit comprising:

first and second transistors having the bases thereof coupled to a predetermined bias voltage, the collectors coupled to a positive supply and the emitters thereof open;

biasing means coupled between the emitters of the first and second transistors and a negative supply biasing said first and second transistors at different current densities;

a first capacitor having a first portion coupled alternately to the predetermined bias voltage and emitter of the first transistor by first clocking means in response to non-overlapping clock signals, for providing a first charge related to the $V_{be}$ of the first transistor;

a second capacitor having a first portion coupled alternately to the emitter of the first transistor and the emitter of the second transistor by second clocking means in response to said non-overlapping clock signals, for providing a second charge related to the difference in the $V_{be}$ of the first and second transistors; and an amplifier coupled to the first and second capacitors, for providing a reference voltage proportional to the sum of the first and second charges.

7. A circuit for producing a substantially temperature independent reference voltage, the circuit comprising:

first and second transistors having the bases thereof coupled to a predetermined bias voltage, the collectors coupled to a positive supply and the emitters thereof open;

biasing means coupled between the emitters of the first and second transistors and a negative supply biasing said first and second transistors at different current densities;

a first capacitor having a first portion coupled alternately to the predetermined bias voltage and emitter of the first transistor, for providing a first charge related to the $V_{be}$ of the first transistor;

a second capacitor having a first portion coupled alternately to the emitter of the first transistor and the emitter of the second transistor, for providing a second charge related to the difference in the $V_{be}$ of the first and second transistors; and an amplifier coupled to the first and second capacitors, for providing a reference voltage proportional to the sum of the first and second charges, comprising an operational amplifier, a feedback capacitor, and switching means for periodically discharging the feedback capacitor, said amplifier providing a reference voltage proportional to the sum of the first and second charges.

* * * * *